United States Patent
Baumann et al.

(10) Patent No.: US 7,955,776 B2
(45) Date of Patent: Jun. 7, 2011

(54) PHOTOPOLYMER COMPOSITION SUITABLE FOR LITHOGRAPHIC PRINTING PLATES

(75) Inventors: Harald Baumann, Osterode/Harz (DE); Bernd Strehmel, Berlin (DE); Detlef Pietsch, Badenhausen (DE); Udo Dwars, Herzberg/Harz (DE); Tanja Ebhardt, Osterode (DE); Axel Draber, Osterode (DE)

(73) Assignee: Eastman Kodak Company, Rochester, NY (US)

( * ) Notice: Subject to any disclaimer, the term of this patent is extended or adjusted under 35 U.S.C. 154(b) by 570 days.

(21) Appl. No.: 11/995,213

(22) PCT Filed: Jul. 3, 2006

(86) PCT No.: PCT/EP2006/006462
§ 371 (c)(1),
(2), (4) Date: Jan. 10, 2008

(87) PCT Pub. No.: WO2007/009580
PCT Pub. Date: Jan. 25, 2007

(65) Prior Publication Data
US 2008/0248424 A1 Oct. 9, 2008

(30) Foreign Application Priority Data
Jul. 20, 2005 (DE) .......................... 10 2005 033 971

(51) Int. Cl.
G03F 7/26 (2006.01)
G03F 7/00 (2006.01)

(52) U.S. Cl. ................ 430/270.1; 430/271.1; 430/283.1

(58) Field of Classification Search ............... 430/270.1, 430/271.1, 283.1, 302; 101/453
See application file for complete search history.

(56) References Cited

U.S. PATENT DOCUMENTS

| | | | | |
|---|---|---|---|---|
| 4,019,972 A | * | 4/1977 | Faust | 430/283.1 |
| 4,229,658 A | * | 10/1980 | Gonser | 250/504 R |
| 5,346,805 A | * | 9/1994 | Kondo et al. | 430/281.1 |

FOREIGN PATENT DOCUMENTS

| | | | |
|---|---|---|---|
| EP | 0582753 B1 | * | 11/1992 |
| EP | 0 582 753 | | 12/1995 |
| JP | 2001117217 A | * | 4/2001 |
| WO | 2004/049068 | | 6/2004 |
| WO | 2004/049069 | | 6/2004 |

* cited by examiner

*Primary Examiner* — Cynthia H Kelly
*Assistant Examiner* — Chanceity N Robinson
(74) *Attorney, Agent, or Firm* — J. Lanny Tucke

(57) ABSTRACT

Radiation-sensitive element comprising (a) a substrate and (b) a radiation-sensitive coating comprising (i) at least one component selected from photoinitiators and sensitizer/coinitiator systems which absorbs radiation of a wavelength in the range of 250 to 1,200 nm; (ii) at least one oligomer A of formula (I) wherein $X^1$, $X^2$ and $X^3$ are independently selected from straight-chain or cyclic $C_4$-$C_{12}$ alkylene and $C_6$-$C_{10}$ arylene, a heterocyclic group, a heteroaromatic group and combinations of two or more of the above, $R^1$, $R^2$ and $R^3$ are independently selected from (II) and (III) with the proviso that (1) n=0 in at least one of the groups $R^1$, $R^2$ and $R^3$, and (2) n>2 in at least one of the groups $R^1$, $R^2$ and $R^3$, and (3) at least one group $R^6$ is different from H in formula (III).

18 Claims, No Drawings

PHOTOPOLYMER COMPOSITION SUITABLE FOR LITHOGRAPHIC PRINTING PLATES

The present invention relates to radiation-sensitive elements, in particular radiation-sensitive elements whose coating comprises an oligomer with biuret structural unit. The invention furthermore relates to a process for the production of such elements, a radiation-sensitive composition suitable for the production of such elements, as well as a process for the production of an imaged element from such radiation-sensitive elements.

Lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Photosensitive mixtures have been used for years in photopolymerizable compositions for the production of photosensitive materials such as e.g. soldering masks for printed circuits and printing plates. However, an improved sensitivity in particular in the visible spectral range is required for new and advanced applications (e.g. exposure by means of lasers) so that the exposure time can be shortened. From an economic point of view it is also important that low-intensity lasers can be used which are less expensive and more reliable than high-intensity lasers. Therefore, efforts have been made for some time to increase the sensitivity of photosensitive mixtures that are to be used in photopolymerizable compositions.

EP 0 355 387 A2 describes a photopolymerizable mixture comprising an acrylic or alkacrylic acid ester of the formula

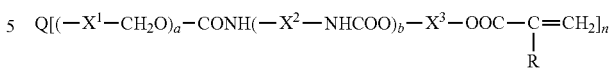

a polymeric binder, a photoreducible dye, a trihalogenmethyl compound and a photoinitiator selected from acridine, phenazine and quinoxaline compounds. However, the mentioned esters lead to the formation of sludge in the developer bath.

DE 23 61 041 A1, EP 0 582 753 A1 and JP 2001-117217 describe photopolymerizable coatings comprising monomers with urethane groups and ethylenically unsaturated groups. It has been found that aged coatings are difficult to develop.

The U.S. Pat. Nos. 3,856,830; 4,999,271 and 6,207,347 B1 also describe ethylenically unsaturated urethane monomers. While photopolymerizable coatings produced with these monomers exhibit good sensitivity, further improvement would be desirable.

It is the object of the present invention to provide novel radiation-sensitive elements exhibiting improved properties compared to those known in the prior art; in particular a high degree of photosensitivity, a high degree of thermal stability and high resolution in combination with good storage stability and—in the case of printing plates—yielding a large number of copies on the printing machine. Furthermore, no or very little sludge should be formed in the developer bath during developing.

This object is achieved by providing a radiation-sensitive element comprising
(a) a substrate and
(b) a radiation-sensitive coating comprising
  (i) at least one component selected from photoinitiators and sensitizer/coinitiator systems which absorbs radiation of a wavelength in the range of 250 to 1,200 nm;
  (ii) at least one oligomer A of formula (I)

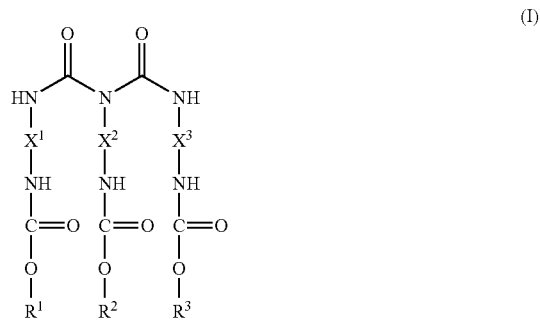

(I)

wherein $X^1$, $X^2$ and $X^3$ are independently selected from straight-chain or cyclic $C_4$-$C_{12}$ alkylene and $C_6$-$C_{10}$ arylene, a heterocyclic group, a heteroaromatic group and combinations of two or more of the above, $R^1$, $R^2$ and $R^3$ are independently selected from

(II)

and wherein

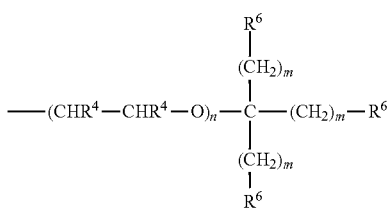
(III)

each $R^4$ is independently selected from a hydrogen atom and $CH_3$, each n is independently 0 or an integer from 1 to 20, each m is independently 0 or 1;
if n in formula (II) is 0, $R^5$ is independently selected from

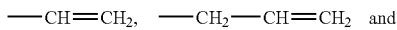

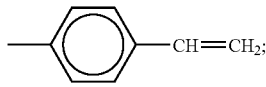

if n in formula (II) is an integer from 1 to 20, $R^5$ is independently selected from

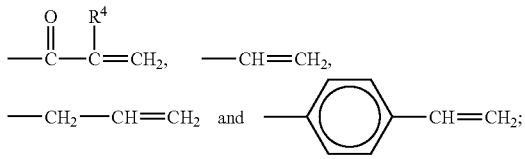

and each $R^6$ is independently selected from a hydrogen atom,

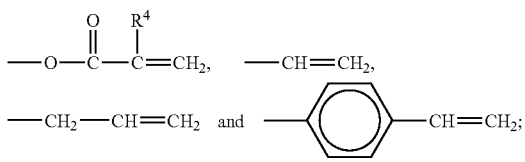

with the proviso that (1) n=0 in at least one of the groups $R^1$, $R^2$ and $R^3$, and (2) n>2 in at least one of the groups $R^1$, $R^2$ and $R^3$, and (3) at least one group $R^6$ is different from H in formula (III).

Unless defined otherwise, the terms "alkyl group and alkylene group" as used in the present invention refer to a straight-chain, branched or cyclic alkyl group or alkylene group. These groups can optionally comprise one or more substituents selected from halogen atoms (fluorine, chlorine, bromine, iodine), $C_1$-$C_{12}$ alkoxy groups,

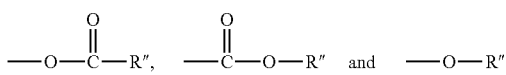

(wherein R" is a $C_1$-$C_{18}$ alkyl group).

Unless defined otherwise, the terms "aryl group or arylene group" as used in the present invention refer to an aromatic carbocyclic mono- or divalent group with one ring or more fused rings, which can optionally comprise one or more substituents selected from halogen atoms (fluorine, chlorine, bromine, iodine), $C_1$-$C_{12}$ alkoxy groups,

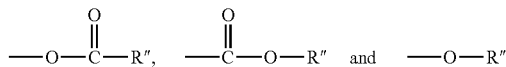

(wherein R" is a $C_1$-$C_{18}$ alkyl group).

Unless defined otherwise, the term "heterocyclic group" as used in the present invention refers to a saturated or unsaturated (non-aromatic) cyclic group wherein one or more ring carbon atoms are replaced with heteroatoms selected from O, S, Se, Te and N— preferably O, S and N—; preferably, one or two carbon atoms are replaced. Preferably, the group is a 5- or 6-membered heterocyclic group. The heterocyclic group can optionally comprise one or more substituents (bonded to a C atom and/or an N atom). Preferably, the heterocyclic group is unsubstituted or comprises one substituent. The optional substituents are preferably selected from halogen atoms, alkyl groups, CN, $NO_2$, $NR^{IV}_2$, $OR^{IV}$ and $SR^{IV}$, wherein each $R^{IV}$ is independently selected from hydrogen and alkyl. Examples of heterocyclic groups include piperidyl, piperazinyl, tetrahydroquinolinyl, pyrrolidyl, tetrahydrofurfuryl, tetrahydropyranyl, morpholinyl and tetrahydrothiophenyl.

Unless defined otherwise, the term "heteroaromatic group" as used in the present invention refers to an aryl group wherein one or more ring carbon atoms are replaced with heteroatoms selected from O, S, Se, Te and N— preferably O, S and N—; preferably, one, two or three carbon atoms are replaced. The heteroaromatic group can optionally comprise one or more substituents preferably selected from halogen atoms, alkyl groups, CN, $NR^{IV}_2$, $COOR^{IV}$, $OR^{IV}$ and $SR^{IV}$ (especially preferred alkyl groups, $OR^{IV}$ and $SR^{IV}$), wherein each $R^{IV}$ is independently selected from hydrogen and alkyl. The substituents can be bonded to C atoms and/or N atoms. Examples of heteroaromatic groups include imidazolyl, 1,2,4-triazolyl, pyrazolyl, thiazolyl, pyridyl, quinolinyl, pyrimidyl, 1,3,5-thiadiazolyl, 1,3,5-oxadiazolyl, 1,3,5-triazinyl, benzimidazolyl, acridinyl, furanyl and thienyl.

The terms "(meth)acrylate" and "(meth)acrylic acid" indicate that both "acrylate" and "methacrylate" and "methacrylic acid" and "acrylic acid", respectively, are meant.

In order to obtain a high degree of sensitivity in combination with good developability and storage stability while at the same time preventing the formation of sludge in the processor it is important that the radiation-sensitive composition comprises at least one oligomer of the biuret type of formula (I).

In the oligomer of formula (I), the groups $X^1$, $X^2$ and $X^3$ are independently selected from $C_4$-$C_{12}$ alkylene groups (preferably $C_4$-$C_8$ alkylene, especially preferred hexamethylene), $C_6$-$C_{10}$ arylene (preferably phenylene or naphthylene), divalent heterocyclic groups, divalent heteroaromatic groups and combinations of two or more of the above (e.g. alkylaryl, alkylarylalkyl and arylalkylaryl); heterocyclic and heteroaromatic groups are not preferred. It is preferred that $X^1=X^2=X^3$; especially preferred $X^1=X^2=X^3$=hexamethylene.

The groups $R^1$, $R^2$ and $R^3$ are independently selected from

—(CHR$^4$—CHR$^4$—O)$_n$—R$^5$  (II)

and and  ——(CHR⁴—CHR⁴—O)ₙ—C((CH₂)ₘ—R⁶)((CH₂)ₘR⁶)  (III)

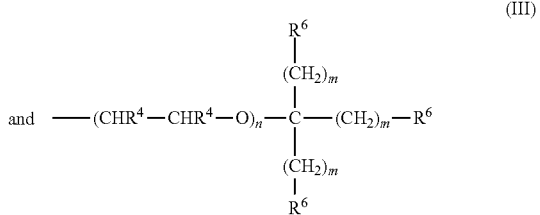

It is essential for the present invention that in at least one of groups $R^1$, $R^2$ and $R^3$ n=0, and in at least one n>2; if n=0 in one group and n>2 in another, n in the third group can be 0 or any integer from 1 to 20. Preferably, n=0 in two of the groups $R^1$, $R^2$ and $R^3$, and n>2 in the third.

If n=0 in formula (II), $R^5$ is independently selected from —CH=CH₂, —CH₂—CH=CH₂ and

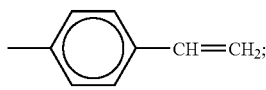

if n is an integer from 1 to 20, $R^5$ is selected from

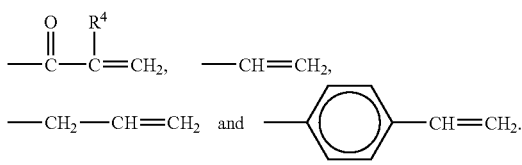

In formula (II), n is preferably >2; especially preferred, n≧6.

In formula (III), n is preferably 0 and m is preferably 0 or 1.

$R^6$ is preferably

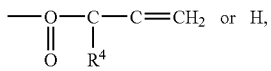

with the proviso that at least one $R^6$ is different from H.

It is preferred that the at least one group of $R^1$, $R^2$ and $R^3$ wherein n>2 is represented by formula (II).

It is preferred that in the spacer —(CHR₄—CHR⁴—O)— either both groups $R^4$ represent hydrogen, or that one represent hydrogen and the other CH₃. The spacer —(CHR⁴—CHR⁴—O)ₙ— can for example be polyethylene glycol units, polypropylene glycol units or a block copolymer unit with one or more polypropylene glycol blocks and one or more polyethylene glycol blocks.

According to one embodiment, two of the groups $R^1$, $R^2$ and $R^3$ are glycerin-1,3-di(meth)acrylate groups and the third a polyethylene glycol(meth)acrylate group or a polypropylene glycol(meth)acrylate group (each with n>2, preferably n≧6).

The oligomer A of formula (I) can be prepared as follows:

In a first step, the basic biuret structure is prepared by reacting at least one diisocyanate of the formula

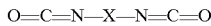

(wherein X is defined as are $X^1$, $X^2$ and $X^3$) and an appropriately selected amount of water, usually 3 moles diisocyanate(s) and 1 mole water (see also e.g. DE-B-1,101,394 and Houben-Weyl, *Methoden der organischen Chemie* [methods in organic chemistry], 4ᵗʰ edition (1963), Vol. 14/2, pages 69 et seqq.). The reaction is preferably carried out without a solvent.

In a second step, the terminal isocyanate groups are reacted with at least two different unsaturated compounds of the following formula comprising one or more hydroxy groups

and/or

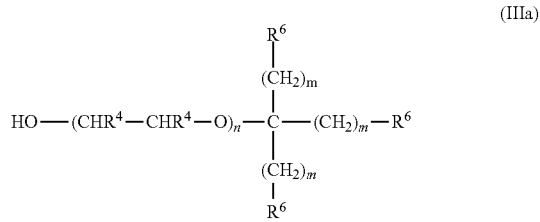

(wherein $R^4$, $R^5$, $R^6$, n and m are as defined above) so that a compound of formula (I) is obtained wherein n=0 in at least one of groups $R^1$, $R^2$ and $R^3$ and n>2 in at least one of them.

The reaction can be carried out in stages (i.e. the unsaturated compounds are reacted with the biuret one after the other) or simultaneously (i.e. the unsaturated compounds are all reacted with the biuret at the same time).

The reaction is usually carried out in aprotic solvents such as e.g. benzene, toluene, xylene, a ketone (e.g. methyl ethyl ketone) or an ester (e.g. butyl acetate) in the presence of a catalyst (e.g. tertiary amines or tin organyls such as dibutyltin dilaurate and dioctyltin dilaurate) and an inhibitor for preventing thermal polymerization at a temperature between room temperature and about 80° C.

By appropriately selecting the molar ratio of the unsaturated compounds, the ratio of the different groups $R^1$, $R^2$ and $R^3$ can be controlled. Details regarding the preparation of the oligomers A can be inferred from e.g. DE-A-2,361,041.

The radiation-sensitive coating can comprise one or more kinds of the oligomer A.

The amount of oligomer A in the radiation-sensitive layer is not particularly restricted, however, it is preferably present in an amount of 10 to 90 wt.-% (especially preferred 10 to 70 wt.-%), based on the dry layer weight.

The radiation-sensitive coating furthermore comprises at least one absorber component selected from photoinitiators and sensitizer/coinitiator systems.

The absorber component is selected such that it is capable of significant absorption in the range in which the radiation source to be used later on during imaging emits; preferably, the absorber shows an absorption maximum in that range. Thus, if the radiation-sensitive element is going to be imaged by means of an IR laser, the absorber should essentially absorb radiation in the range of about 750 to 1,200 nm and preferably show an absorption maximum in that range. On the other hand, if imaging is to be carried out by means of UV radiation, the absorber should essentially absorb radiation in the range of about 250 to 400 nm and preferably show an absorption maximum in that range. Suitable photoinitiators and/or sensitizers are known to the person skilled in the art, or it can easily be determined whether significant absorption occurs in the desired wave length range by means of simple tests (e.g. recording an absorption spectrum).

In the present invention, a photoinitiator is a compound capable of absorbing radiation when exposed and of forming free radicals by itself, i.e. without the addition of coinitiators. Examples of suitable photoinitiators include triazine derivatives with 1 to 3 $CX_3$ groups (wherein every X is independently selected from a chlorine or bromine atom, and is preferably a chlorine atom), hexaarylbisimidazole compounds, benzoin ethers, benzil ketals, oxime ethers, oxime esters, α-hydroxy- or α-amino-acetophenones, acylphosphines, acylphosphine oxides, acylphosphine sulfides, metallocenes, peroxides etc. Examples of suitable triazine derivatives include 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, and 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine. Suitable oxime ethers and oxime esters are for example those derived from benzoin. Preferred metallocenes are for example titanocenes with two five-membered cyclodienyl groups such as e.g. cyclopentadienyl groups and one or two six-membered aromatic groups having at least one ortho-fluorine atom and optionally also one pyrryl group; most preferred metallocenes are bis(cyclopentadienyl)-bis-[2,6-difluoro-3-(pyrr-1-yl)-phenyl]titanium and dicyclopentadiene-bis-2,4,6-trifluorophenyl-titanium or zirconium.

In the present invention, a single photoinitiator or a mixture of two or more can be used.

The photoinitiators can be used alone or in combination with one or more coinitiators; the addition of coinitiators can increase the effectiveness of the photoinitiation.

The amount of photoinitiator(s) is not particularly restricted; however, if photoinitiators are present, it is preferably in the range of 0.2 to 25 wt.-%, based on the dry layer weight, especially preferred 0.5 to 15 wt.-%.

A sensitizer as referred to in the present invention is a compound which can absorb radiation when it is exposed but which cannot by itself, i.e. without the addition of coinitiators, form free radicals.

All light-absorbing compounds that are photooxidizable or photoreducible or capable of transferring their excitation energy to receptor molecules are suitable sensitizers for use in the present invention. Examples of such dyes include cyanine dyes, merocyanine dyes, oxonol dyes, diarylmethane dyes, triarylmethane dyes, xanthene dyes, coumarin derivatives, ketocoumarin dyes, acridine dyes, phenazine dyes, quinoxaline dyes, pyrrylium dyes or thiapyrrylium dyes, azaanulene dyes (such as phthalocyanines and porphyrines), indigo dyes, anthraquinone dyes, polyarylenes, polyarylpolyenes, 2,5-diphenylisobenzofuranes, 2,5-diarylfuranes, 2,5-diarylthiofuranes, 2,5-diarylpyrroles, 2,5-diarylcyclopentadienes, polyarylphenylenes, polyaryl-2-pyrazolines, carbonyl compounds such as aromatic ketones or quinones, e.g. benzophenone derivatives, Michler's ketone, thioxanthone derivatives, anthraquinone derivatives and fluorenone derivatives.

For IR-sensitive elements, the sensitizers are for example selected from carbon black, phthalocyanine pigments/dyes and pigments/dyes of the polythiophene-squarylium, thiazolium, croconate, merocyanine, cyanine, indolizine, pyrylium or metaldithiolin classes, especially preferred from the cyanine class. The compounds mentioned in Table 1 of U.S. Pat. No. 6,326,122 for example are suitable IR absorbers. Further examples can be found in U.S. Pat. Nos. 4,327,169, 4,756,993, 5,156,938, WO 00/29214, U.S. Pat. No. 6,410,207 and EP-A-1 176 007.

According to one embodiment, a cyanine dye of formula (IV)

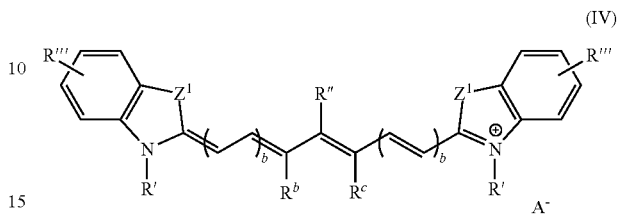

is used, wherein each $Z^1$ independently represents S, O, $NR^a$ or $C(alkyl)_2$;
each R' independently represents an alkyl group, an alkylsulfonate group or an alkylammonium group;
R'' represents a halogen atom, $SR^a$, $OR^a$, $SO_2R^a$ or $NR^a_2$;
each R''' independently represents a hydrogen atom, an alkyl group, —$COOR^a$, —$OR^a$, —$SR^a$, —$NR^a_2$ or a halogen atom; R''' can also be a benzofused ring;
$A^-$ represents an anion;
$R^b$ and $R^c$ either both represent hydrogen atoms or, together with the carbon atoms to which they are bonded, form a carbocyclic five- or six-membered ring;
$R^a$ represents a hydrogen atom, an alkyl or aryl group;
each b is independently 0, 1, 2 or 3.

If R' represents an alkylsulfonate group, an inner salt can form so that no anion $A^-$ is necessary. If R' represents an alkylammonium group, a second counterion is needed which is the same as or different from $A^-$.

$Z^1$ is preferably a $C(alkyl)_2$ group.
R' is preferably an alkyl group with 1 to 4 carbon atoms.
R'' is preferably a halogen atom or $SR^a$.
R''' is preferably a hydrogen atom.
$R^a$ is preferably an optionally substituted phenyl group or an optionally substituted heteroaromatic group (for example, in the case of $SR^a$, the sulfur atom can form part of the aromatic ring).
Preferably, $R^b$ and $R^c$, together with the carbon atoms to which they are bonded, form a carbocyclic five- or six-membered ring.

The counterion $A^-$ is preferably a chloride ion, trifluoromethylsulfonate or a tosylate anion.

Of the IR dyes of formula (II), dyes with a symmetrical structure are especially preferred. Examples of especially preferred dyes include:

2-[2-[2-Phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indoliumtosylate, 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium-tosylate and 2-[2-[2-chloro-3-[2-ethyl-(3H-benzthiazole-2-ylidene)-ethylidene]-1-cyclohexene-1-yl]-ethenyl]-3-ethyl-benzthiazolium-tosylate.

The following compounds are also IR absorbers suitable for the present invention:
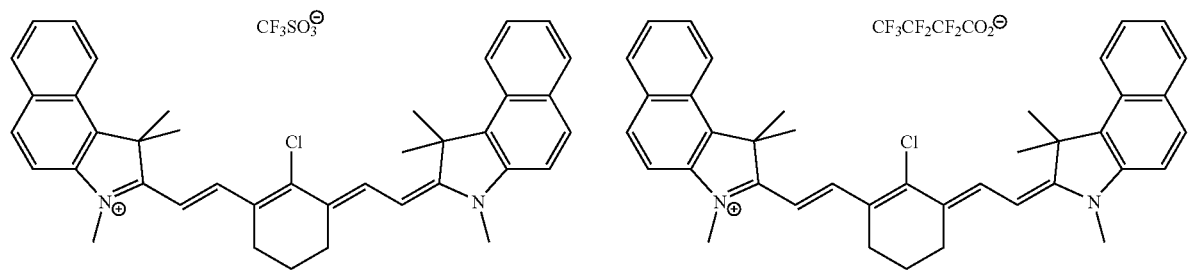
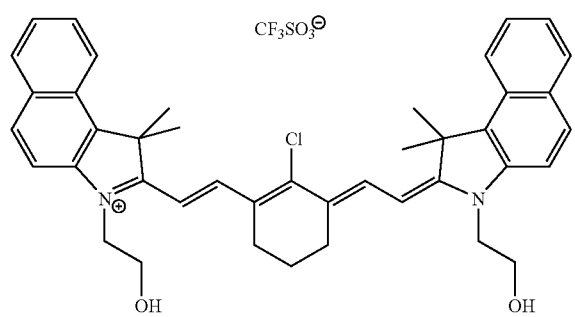
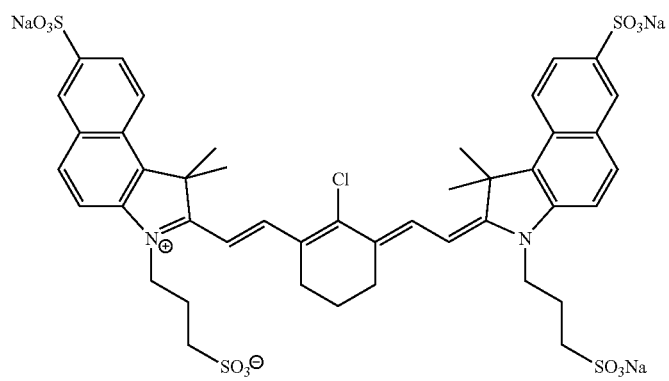
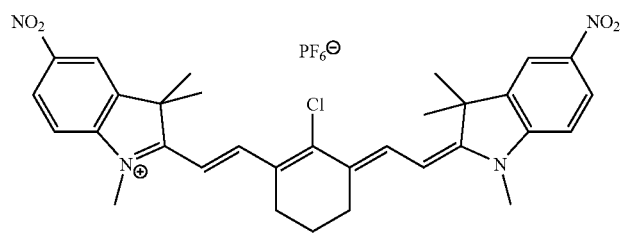
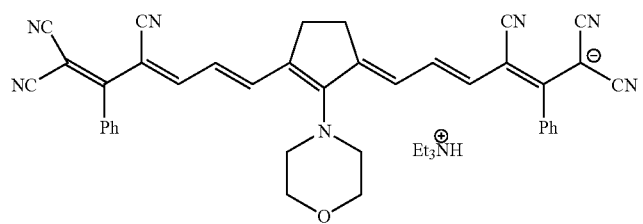

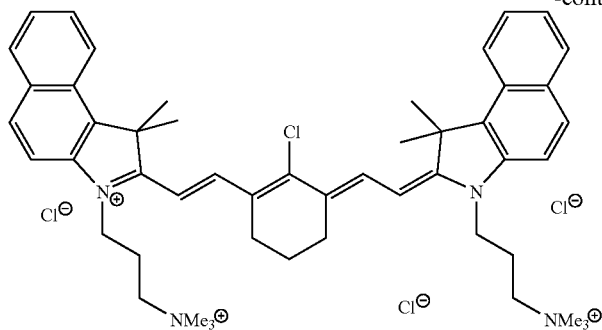
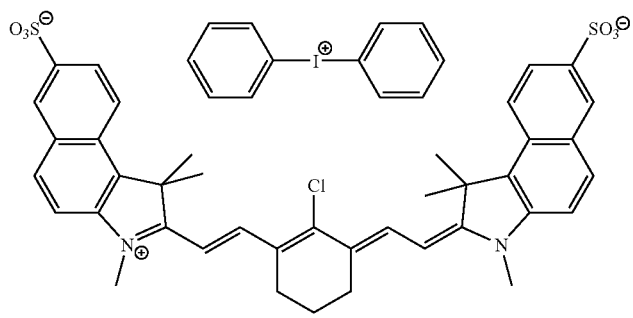
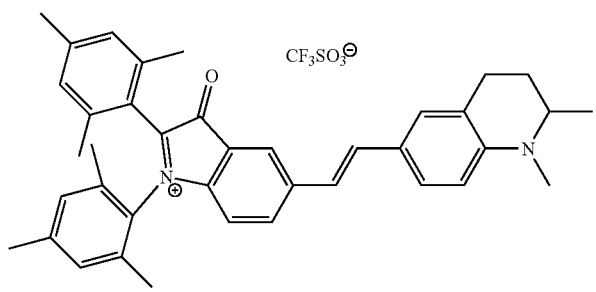
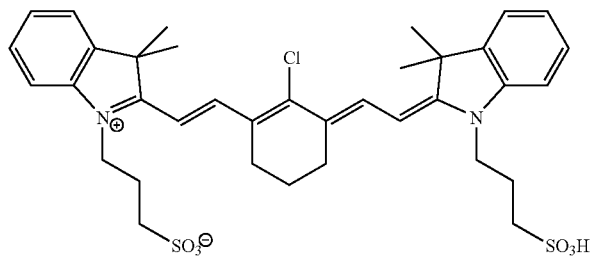
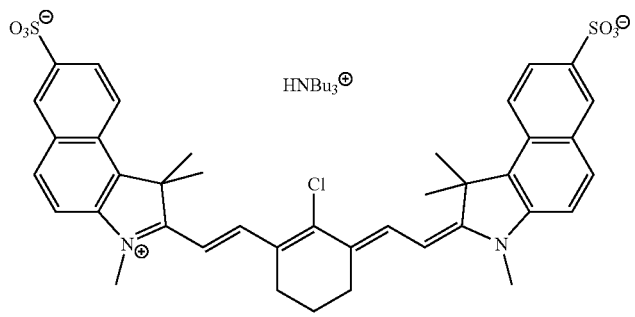

-continued
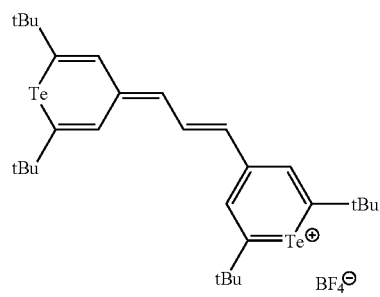
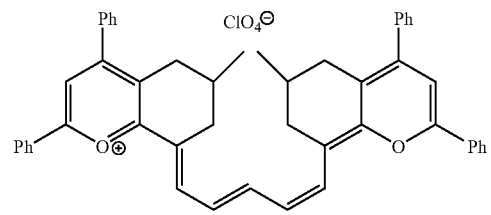
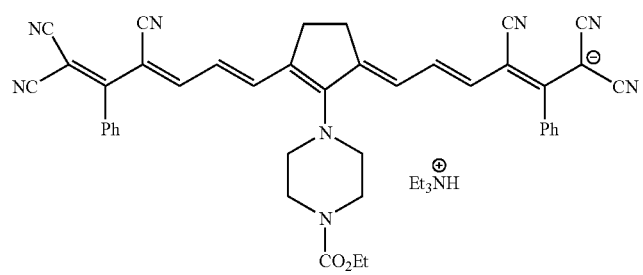
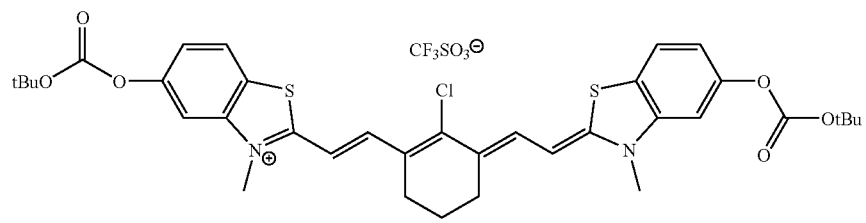
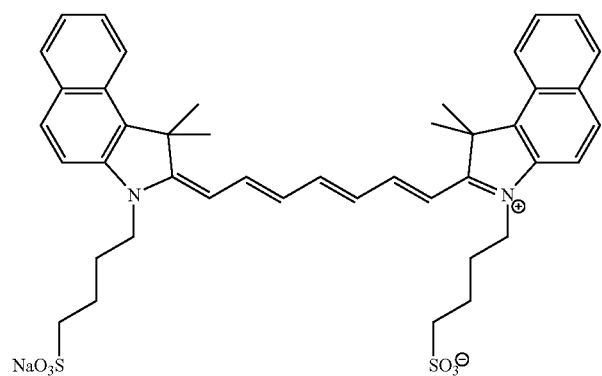
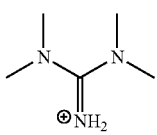
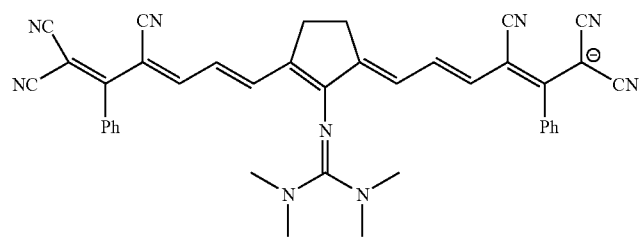

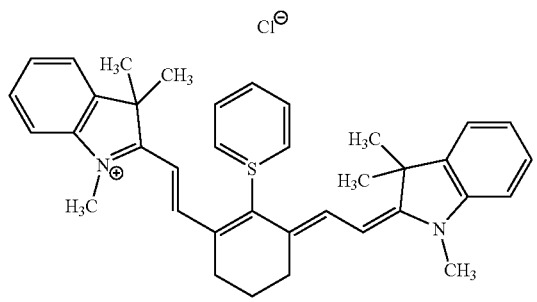
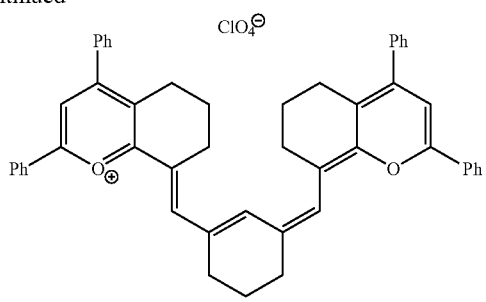

In the present invention, one sensitizer or a mixture of two or more can be used.

The sensitizers are used in combination with one or more coinitiators. Additionally, photoinitiators can be used; however, this is not preferred.

The amount of sensitizer(s) is not particularly restricted; however, if sensitizers are present, it is preferably in the range of 0.2 to 15 wt.-%, based on the dry layer weight, especially preferred 0.5 to 10 wt.-%. If both photoinitiators and sensitizers are present in the coating, their total amount is preferably 0.5 to 30 wt.-%, based on the dry layer weight, especially preferred 1 to 15 wt.-%.

A coinitiator as referred to in the present invention is a compound that is essentially unable to absorb when exposed and forms free radicals together with the light-absorbing sensitizers or photoinitiators. Coinitiators suitable for use in the present invention include e.g. amines such as alkanol amines or 4-dialkylaminobenzoic acid esters, diaryliodonium salts, triarylsulfonium salts, aryldiazonium salts, N-arylglycine derivatives, diaryldiiminodiacetic acid compounds, aryloxyacetic acid, aromatic sulfonyl halides, trihalomethylsulfones, nitrogen heterocycles with N-oxide substituents (such as alkoxy pyridinium salts), nitrogen heterocycles such as N-benzoyl-oxyphthalimide, diazosulfonates, 9,10-dihydroanthracene derivatives, thiol compounds (e.g. mercaptobenzthiazole, mercaptobenzimidazole and mercaptotriazole), triazine derivatives with 1 to 3 $CX_3$ groups (wherein every X is independently selected from a chlorine or bromine atom, and is preferably a chlorine atom), hexaarylbisimidazole compounds, benzoin ethers, benzyl ketals, oxime ethers, oxime esters, α-hydroxy- or α-amino-acetophenones, acylphosphines, acylphosphine oxides, acylphosphine sulfides, metallocenes, peroxides etc., carbonyl compounds such as aromatic ketones or quinones, e.g. benzophenone derivatives, Michler's ketone, thioxanthone derivatives, anthraquinone derivatives and fluorenone derivatives.

Suitable 2,2',4,4',5,5'-hexaarylbiimidazoles (in the following simply referred to as hexaarylbiimidazoles) are represented by the following formula (V):

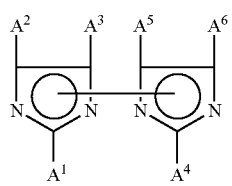

(V)

wherein $A^1$-$A^6$ are substituted or unsubstituted $C_5$-$C_{20}$ aryl groups which are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, e.g. halogen atoms (fluorine, chlorine, bromine, iodine), —CN, $C_1$-$C_6$ alkyl (optionally with one or more substituents selected from halogen atoms, —CN and —OH), $C_1$-$C_6$ alkoxy, $C_1$-$C_6$ alkylthio, ($C_1$-$C_6$ alkyl)sulfonyl.

Preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Examples include:
2,2'-Bis(bromophenyl)-4,4',5,5'-tetraphenylbiimidazole,
2,2'-bis(p-carboxyphenyl)-4,4',5,5"-tetraphenylbiimidazole,
2,2'-bis(o-chlorophenyl)-4,4',5,5'-tetrakis(p-methoxyphenyl)-biimidazole,
2,2'-bis(p-chlorophenyl)-4,4',5,5'-tetrakis(p-methoxyphenyl)-biimidazole,
2,2'-bis(p-cyanophenyl)-4,4'5,5'-tetrakis(p-methoxyphenyl)-biimidazole,
2,2'-bis(2,4-dichlorophenyl)-4,4',5,5'-tetraphenylbiimidazole,
2,2'-bis(2,4-dimethoxyphenyl)-4,4',5,5'-tetraphenylbiimidazole,
2,2'-bis(o-ethoxyphenyl)-4,4',5,5'-tetraphenylbiimidazole,
2,2'-bis(m-fluorophenyl)-4,4',5,5'-tetraphenylbiimidazole,
2,2'-bis(o-fluorophenyl)-4,4',5,5'-tetraphenylbiimidazole,
2,2'-bis(p-fluorophenyl)-4,4',5,5'-tetraphenylbiimidazole,
2,2'-bis(o-hexoxyphenyl)-4,4',5,5'-tetraphenylbiimidazole,
2,2'-bis(o-hexylphenyl)-4,4',5,5'-tetrakis(p-methoxyphenyl)-biimidazole,
2,2'-bis(3,4-methylenedioxyphenyl)-4,4',5,5'-tetraphenylbiimidazole,
2,2'-bis(o-chlorophenyl)-4,4',5,5'-tetrakis(m-methoxyphenyl)biimidazole,
2,2'-bis(o-chlorophenyl)-4,4',5,5'-tetrakis[m-(betaphenoxyethoxyphenyl)]biimidazole,
2,2'-bis(2,6-dichlorophenyl)-4,4',5,5'-tetraphenylbiimidazole,
2,2'-bis(o-methoxyphenyl)-4,4',5,5'-tetraphenylbiimidazole,
2,2'-bis(p-methoxyphenyl)-4,4'-bis(o-methoxyphenyl)-5,5'-diphenylbiimidazole,
2,2'-bis(o-nitrophenyl)-4,4',5,5'-tetraphenylbiimidazole,
2,2'-bis(p-phenylsulfonylphenyl)-4,4',5,5'-tetraphenyl-biimidazole,
2,2'-bis(p-sulfamoylphenyl)-4,4',5,5'-tetraphenylbiimidazole,
2,2'-bis(2,4,5-trimethylphenyl)-4,4',5,5'-tetraphenylbiimidazole,
2,2'-di-4-biphenylyl-4,4',5,5'-tetraphenylbiimidazole, 2,2'-di-1-naphthyl-4,4',5,5'-tetrakis(p-methoxyphenyl)-biimidazole,
2,2'-di-9-phenanthryl-4,4',5,5'-tetrakis(p-methoxyphenyl)-biimidazole,
2,2'-diphenyl-4,4',5,5'-tetra-4-biphenylylbiimidazole,
2,2'-diphenyl-4,4',5,5'-tetra-2,4-xylylbiimidazole,
2,2'-di-3-pyridyl-4,4',5,5'-tetraphenylbiimidazole,
2,2'-di-3-thienyl-4,4',5,5'-tetraphenylbiimidazole,
2,2'-di-o-tolyl-4,4',5,5'-tetraphenylbiimidazole,
2,2'-di-p-tolyl-4,4'-di-o-tolyl-5,5'-diphenylbiimidazole,
2,2'-di-2,4-xylyl-4,4',5,5'-tetraphenylbiimidazole,
2,2',4,4',5,5'-hexakis(p-benylthiophenyl)biimidazole,
2,2',4,4',5,5'-hexa-1-naphthylbiimidazole,
2,2',4,4',5,5'-hexaphenylbiimidazole,
2,2'-bis(2-nitro-5-methoxyphenyl)-4,4',5,5'-tetraphenylbiimidazole, and
2,2'-bis(o-nitrophenyl)-4,4',5,5'-tetrakis(m-methoxyphenyl)biimidazole,
2,2'-bis(2-chloro-5-sulfophenyl)-4,4',5,5'-tetraphenylbiimidazole,
and especially preferred:
2,2'-bis(o-chlorophenyl)-4,4',5,5'-tetraphenylbiimidazole,
2,2'-bis(o-chlorophenyl)-4,4',5,5'-tetra(p-fluorophenyl)biimidazole,
2,2'-bis(o-bromophenyl)-4,4',5,5'-tetra(p-iodophenyl)biimidazole,
2,2'-bis(o-chlorophenyl)-4,4',5,5'-tetra(p-chloronaphthyl)biimidazole,
2,2'-bis(o-chlorophenyl)-4,4',5,5'-tetra(p-chlorophenyl)biimidazole,
2,2'-bis(o-bromophenyl)-4,4',5,5'-tetra(p-chloro-p-methoxyphenyl)biimidazole,
2,2'-bis(o-chlorophenyl)-4,4',5,5'-tetra(o,p-dichlorophenyl)biimidazole,
2,2'-bis(o-chlorophenyl)-4,4',5,5'-tetra(o,p-dibromophenyl)biimidazole,
2,2'-bis(o-bromophenyl)-4,4',5,5'-tetra(o,p-dichlorophenyl)biimidazole or
2,2'-bis(o,p-dichlorophenyl)-4,4',5,5'-tetra(o,p-dichlorophenyl)biimidazole;
but the invention is not restricted to these compounds.

Suitable hexaarylbiimidazoles can be prepared according to known methods (see e.g. U.S. Pat. No. 3,445,232). A preferred process is the oxidative dimerization of corresponding triarylimidazoles with iron-(II)-hexacyanoferrate (II) in an alkali solution.

It is irrelevant for the purposes of the present invention which hexaarylbiimidazole isomer (or mixture of isomers) is used (e.g. 1,2'-, 1,1'-, 1,4',2,2'-, 2,4'- and 4,4'-isomer), as long as it is photodissociable and provides triarylimidazolyl radicals in the process.

The trihalogenmethyl compounds suitable as coinitiators are capable of forming free radicals. Trihalogenmethyl-substituted triazines and trihalogenmethyl-arylsulfones are preferred. The following can be mentioned as examples (without restricting the invention to these compounds):
2-(4-Methoxyphenyl)-4,6-bis(trichloromethyl)-s-triazine,
2-(4-chlorophenyl)-4,6-bis-(trichloromethyl)-s-triazine,
2-phenyl-4,6-bis(trichloromethyl)-s-triazine,
2,4,6-tri-(trichloromethyl)-s-triazine,
2,4,6-tri-(tribromomethyl)-s-triazine and
tribromomethylphenylsulfone.

Many coinitiators can also function as photoinitiators when they are exposed in their absorption band. This way, photosensitive layers can be obtained that are sensitive over a wide spectral range because e.g. a photoinitiator or sensitizer covers the long-wavelength spectral range (IR and/or visible range) and a coinitiator covers the short-wavelength spectral range (e.g. the UV range). This effect can be advantageous if the consumer wants to irradiate the same material with different radiation sources. In this case, the coinitiator functions as an actual coinitiator in the sense of the definition given above for the IR or visible range, while it functions as a photoinitiator for the UV range.

In the present invention, one coinitiator or a mixture of coinitiators can be used.

The amount of coinitiator(s) is not particularly restricted; however, it is preferably in the range of 0.2 to 25 wt.-%, based on the dry layer weight, especially preferred 0.5 to 15 wt.-%.

In addition to the free-radical polymerizable oligomers A, the radiation-sensitive coating can also comprise other C—C unsaturated monomers and/or oligomers and/or polymers which comprise at least one C—C double or triple bond. Such compounds are well known to the person skilled in the art and can be used in the present invention without any particular limitations. Esters of acrylic and methacrylic acids, itaconic acid, crotonic acid, isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and trimethacrylate, pentaerythritol triacrylate and trimethacrylate, dipentaerythritolmonohydroxy pentaacrylate and pentamethacrylate, dipentaerythritol hexaacrylate and hexamethacrylate, pentaerythritol tetraacrylate and tetramethacrylate, ditrimethylol propane tetraacrylate and tetra methacrylate, diethyleneglycol diacrylate and dimethacrylate, triethyleneglycol diacrylate and dimethacrylate or tetraethyleneglycol diacrylate and dimethacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride olefin copolymers and hydroxyalkyl(meth)acrylates; polyesters comprising an allylalcoholester group; reaction products of polymeric polyalcohols and isocyanato(meth)acrylates; unsaturated polyesters; (meth)acrylate-terminated polystyrenes, poly(meth)acrylic acid ester, poly(meth)acrylic acids, poly(meth)acrylamides and polyethers. In this connection, the prefix "(meth)" indicates that both derivatives of acrylic acid and of methacrylic acid can be used.

Additional suitable C—C unsaturated free-radical polymerizable compounds are described e.g. in EP-A-1 176 007.

The free-radical polymerizable monomers, oligomers or polymers different from oligomer A are preferably present in an amount of 0 to 40 wt.-%, based on the dry layer weight of the radiation-sensitive coating; when monomers/oligomers are used, it is especially preferred that they be present in an amount of 0 to 20 wt.-%.

Optionally, the radiation-sensitive coating can also comprise a binder or a mixture of binders. The binder is preferably selected from polyvinyl acetals, acrylic polymers and polyurethanes. It is preferred that the binder contain acid groups, especially preferred carboxy groups. Most preferred are acrylic polymers. Binders with acid groups preferably have acid numbers in the range of 20 to 180 mg KOH/g polymer. Optionally, the binder can comprise unsaturated groups in the main chain or the side chains. Such unsaturated bonds are capable of undergoing a free-radical photopolymerization reaction or another photoreaction, such as e.g. a 2+2-photocycloaddition.

The binder is preferably present in an amount of 0 to 90 wt.-%, based on the dry layer weight, especially preferred 10 to 60 wt.-%.

The radiation-sensitive coating can optionally also comprise small amounts of a thermopolymerization inhibitor in order to prevent an undesired thermopolymerization of the ethylenically unsaturated monomer during the production or storage of the photosensitive composition. Suitable examples of inhibitors of thermopolymerization include e.g. hydroquinone, p-methoxyphenol, di-t-butyl-p-cresol, pyrrogallol, t-butylcatechol, benzoquinone, 4,4'-thio-bis-(3-methyl-6-t-butylphenol), 2,2'-methylene-bis-(4-methyl-6-t-butylphenol) and N-nitrosophenylhydroxylamine salts. The amount of polymerization inhibitor in the photosensitive composition of the present invention is preferably 0 to 5 wt.-%, based on the dry layer weight, especially preferred 0.01 to 2 wt.-%. Such thermopolymerization inhibitors are often introduced into the radiation-sensitive coating via commercial monomers or oligomers and are therefore not expressly mentioned.

Furthermore, the radiation-sensitive coating of the present invention can comprise dyes or pigments for coloring the layer. Examples of colorants include e.g. phthalocyanine pigments, azo pigments, carbon black and titanium dioxide, ethyl violet, crystal violet, azo dyes, anthraquinone dyes and cyanine dyes. The amount of colorant is preferably 0 to 20 wt.-%, based on the dry layer weight, especially preferred 0.5 to 10 wt.-%.

For improving the physical properties of the hardened layer, the radiation-sensitive coating of the present invention can additionally comprise further additives such as plasticizers or inorganic fillers. Suitable plasticizers include e.g. dibutyl phthalate, dioctyl phthalate, didodecyl phthalate, dioctyl adipate, dibutyl sebacate, triacetyl glycerin and tricresyl phosphate. The amount of plasticizer is not particularly restricted, however, it is preferably 0 to 10 wt.-%, based on the dry layer weight, especially preferred 0.25 to 5 wt.-%.

The radiation-sensitive coating can also comprise known chain transfer agents such as e.g. mercapto compounds. They are preferably used in an amount of 0 to 15 wt.-%, based on the dry layer weight, especially preferred 0.5 to 5 wt.-%.

Furthermore, the radiation-sensitive coating can comprise leuco dyes such as e.g. leuco crystal violet and leucomalachite green. They are preferably present in an amount of 0 to 10 wt.-%, based on the dry layer weight, especially preferred 0.5 to 5 wt.-%.

Additionally, the radiation-sensitive coating can comprise surfactants. Suitable surfactants include siloxane-containing polymers, fluorine-containing polymers and polymers with ethylene oxide and/or propylene oxide groups. They are preferably present in an amount of 0 to 10 wt.-%, based on the dry layer weight, especially preferred 0.2 to 5 wt.-%.

Other optional components of the radiation-sensitive coating are inorganic fillers such as e.g. $Al_2O_3$ and $SiO_2$. They are preferably present in an amount of 0 to 20 wt.-%, based on the dry layer weight, especially preferred 0.1 to 5 wt.-%.

The radiation-sensitive elements according to the present invention can e.g. be printing plate precursors (in particular precursors of lithographic printing plates), integrated circuit boards or photomasks.

In the production of printing form precursors, a dimensionally stable plate or foil-shaped material is preferably used. Preferably, a dimensionally stable plate or foil-shaped material is used that has already been used as a substrate for printing plates. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive and furthermore exhibits excellent adhesion to the coating. Furthermore, a composite film can be used wherein an aluminum foil has been laminated onto a polyethylene terephthalate film.

A metal substrate, in particular an aluminum substrate, is preferably subjected to at least one treatment, selected from graining (e.g. by brushing in a dry state or brushing with abrasive suspensions, or electrochemical graining, e.g. by means of a hydrochloric acid electrolyte), anodizing and hydrophilizing.

In order to improve the hydrophilic properties of the surface of the metal substrate that has been grained and optionally anodized in sulfuric acid or phosphoric acid, the metal substrate can be subjected to an aftertreatment with an aqueous solution of sodium silicate, calcium zirconium fluoride, polyvinylphosphonic acid or phosphoric acid. Within the framework of the present invention, the term "substrate" also encompasses an optionally pre-treated substrate exhibiting, for example, a hydrophilizing layer on its surface.

The details of the above-mentioned substrate pre-treatment are known to the person skilled in the art.

For producing a radiation-sensitive element, the radiation-sensitive composition of the present invention is applied to the surface of the substrate by means of common coating processes (e.g. spin coating, spray coating, dip coating, coating by means of a doctor blade). It is also possible to apply the radiation-sensitive composition on both sides of the substrate; however, for the elements of the present invention, it is preferred that the radiation-sensitive coating be only applied to one side of the substrate.

Usually, the radiation-sensitive composition is applied from an organic solvent or solvent mixture.

Suitable solvents include low alcohols (e.g. methanol, ethanol, propanol and butanol), glycolether derivatives (e.g. ethylene glycol monomethylether, ethylene glycol dimethylether, propylene glycol monomethylether, ethylene glycol monomethylether acetate, ethylene glycol monoethylether acetate, propylene glycol monomethylether acetate, propylene glycol monoethylether acetate, ethylene glycol monoisopropylether acetate, ethylene glycol monobutylether acetate, diethylene glycol monomethylether, diethylene glycol monoethylether), ketones (e.g. diacetone alcohol, acetyl acetone, acetone, methyl ethyl ketone, cyclohexanone, methyl isobutyl ketone), esters (e.g. methyl lactate, ethyl lactate, ethyl acetate, 3-methoxypropyl acetate and butyl acetate), aromatics (e.g. toluene and xylene), cyclohexane, 3-methoxy-2-propanol, 1-methoxy-2-propanol, methoxymethoxyethanol, γ-butyrolactone and dipolar aprotic solvents (e.g. THF, dimethylsulfoxide, dimethylformamide and N-methylpyrrolidone) and mixtures thereof. The solids content of the radiation-sensitive mixture to be applied depends on the coating method that is used and is preferably 1 to 50 wt.-%.

The dry layer weight of the radiation-sensitive layer is preferably 0.5 to 4 g/m², more preferably 0.8 to 3 g/m².

The additional application of a water-soluble oxygen-impermeable overcoat layer onto the radiation-sensitive layer can be advantageous. The polymers suitable for such an overcoat include, inter alia, polyvinyl alcohol, polyvinyl alcohol/polyvinyl acetate copolymers, polyvinyl pyrrolidone, polyvinyl pyrrolidone/polyvinyl acetate copolymers and gelatin. The layer weight of the overcoat layer can e.g. be 0.1 to 6 g/m², preferably 0.5 to 4 g/m². However, the printing plate precursors according to the present invention show excellent properties even without an overcoat. The overcoat can also comprise matting agents (i.e. organic or inorganic particles with a particle size of 2 to 20 µm) which facilitate the planar positioning of the film during contact exposure.

The thus produced printing plate precursors are image-wise exposed in a manner known to the person skilled in the art with radiation of an appropriate wavelength and subsequently developed with a commercially available aqueous alkaline developer. After image-wise exposure (i.e. prior to developing) a heat treatment at 50 to 180° C., preferably 90 to 150° C., can be carried out.

The developed plates can be treated with a preservative ("gumming") using a common method. The preservatives are aqueous solutions of hydrophilic polymers, wetting agents and other additives.

For certain applications, it is furthermore advantageous to increase the mechanical strength of the printing layers by subjecting them to a heat treatment (what is referred as "baking") and/or overall exposure (e.g. to UV light). For this purpose, prior to the treatment, the plate is treated with a solution that protects the non-image areas such that the heat treatment does not cause these areas to accept ink. A solution suitable for this purpose is e.g. described in U.S. Pat. No. 4,355,096. Baking usually takes place at a temperature in the range of 150 to 250° C. However, printing plates prepared from printing plate precursors according to the present invention show excellent properties even without having been subjected to a heat treatment/overall exposure. When both baking and overall exposure are carried out, the two treatment steps can be performed simultaneously or one after the other.

Lithographic printing plate precursors according to the present invention are characterized by improved photosensitivity in combination with good storage stability; the developed printing plates exhibit excellent abrasion resistance which allows a large number of copies.

Within the framework of the present invention, the term "radiation-sensitive element" also encompasses an element wherein the substrate comprises a radiation-sensitive coating (and optionally an oxygen-impermeable overcoat layer) on both sides. However, a one-sided coating is preferred.

The invention will be explained in more detail in the following examples.

EXAMPLES

The abbreviations used hereinafter are explained as follows:
Desmodur® 100 trifunctional isocyanate (biuret of hexamethylene diisocyanate), available from Bayer,
HMDI hexamethylene diisocyanate
GDMA glycerin-1,3-dimethacrylate (n=0 in formula IIIa)
HEMA (2-hydroxyethyl)methacrylate (n=1 in formula IIa)
PPGMA polypropylene glycol methacrylate (n=6 in formula IIa)
PEGMA polyethylene glycol methacrylate (n=10 in formula IIa)
HEPi 2-(2-hydroxyethyl)-piperidine
HEA (2-hydroxyethyl)acrylate (n=1 in formula IIa)
PETA pentaerythritol triacrylate
DEMA diethylene glycol methacrylate (n=2 in formula IIa)

Preparation of Monomers 1 to 4 and Comparative Monomers 1 to 11

The corresponding diisocyanate, the dibutyltin dilaurate catalyst and the stabilizer 2,6-di-tert.butyl-4-methylphenol were dissolved in methyl ethyl ketone at 40° C.; the amount of methyl ethyl ketone was selected such that the final concentration of non-volatile components was about 30 wt.-%. Then the reaction partner for the diisocyanate was added such that the temperature did not exceed 42° C. After 2 hours of stirring, the temperature war increased to 60° C. and maintained for additional 2 hours. The reaction was monitored by means of IR spectroscopy; at the end no isocyanate could be detected. The formation of monomers m1 to m4 and comparative monomers cm1 to cm11 was then confirmed with GPC.

The starting compounds, their amounts, the solids content of the reaction mixture as well as the amount of double bonds of the resulting products can be inferred from Table 1.

TABLE 1

| Monomer | Isocyanate[1] | Reaction partner[1] | Solids content | mmole double bonds per 1 g |
|---|---|---|---|---|
| m1 | Desmodur 100 (1) | GDMA (2) PPGMA (1) | 29.2% | 3.69 |
| m2 | Desmodur 100 (1) | GDMA (2) PEGMA (1) | 29.3% | 3.45 |
| m3 | Desmodur 100 (1) | GDMA (2) PPGMA (1) | 28.0% | 2.57 |
| m4 | Desmodur 100 (1) | GDMA (2) PEGMA (1) | 27.1% | 2.29 |
| cm1 | HMDI (2) | HEMA (2) HEPi (1) | 29.5% | 2.74 |
| cm2 | Desmodur 100 (1) | HEA (2.5) PETA (1.5) | 29.2% | 5.51 |
| cm3 | Desmodur 100 (1) | GDMA (3) | 28.8% | 5.22 |
| cm4 | Desmodur 100 (1) | GDMA (1.5) HEMA (1.5) | 29.5% | 4.48 |
| cm5 | Desmodur 100 (1) | GDMA (2.25) HEMA (0.75) | 31.3% | 4.88 |
| cm6 | Desmodur 100 (1) | GDMA (0.75) HEMA (2.25) | 36.9% | 4.03 |
| cm7 | Desmodur 100 (1) | HEMA (3) | 27.9% | 3.50 |
| cm8 | HMDI (1) | GDMA (2) | 30.0% | 6.39 |
| cm9 | Desmodur 100 (1) | PPGMA (3) | 27.4% | 1.71 |
| cm10 | Desmodur 100 (1) | PEGMA (3) | 26.8% | 1.47 |
| cm11 | Desmodur 100 (1) | GDMA (2) DEMA (1) | 28.9% | 4.55 |

[1]The numbers in parentheses express the molar ratio.

Examples 1 to 20 and Comparative Examples 1 to 19

An electrochemically grained and anodized aluminum foil was subjected to a treatment with an aqueous solution of polyvinyl phosphonic acid (PVPA). The thus pre-treated substrate was coated with a filtered solution as shown in Table 2 or 3 and then dried for 4 minutes at 90° C. The dry layer weight of the photopolymer layer was about 1.7 g/m² in each case.

TABLE 2

(composition sensitive to 405 nm)

36 ml propylene glycol monomethylether
24 ml methanol

TABLE 2-continued (composition sensitive to 405 nm)

| | |
|---|---|
| 29 ml | methyl ethyl ketone |
| 6.48 g | copolymer of methyl methacrylate and methacrylic acid, dissolved in propylene glycol monomethylether (27.9 wt.-% solids content), acid number: 85 |
| 1.12 g | of a dispersion in propylene glycol monomethylether, comprising 7.25 wt.-% copper phthalocyanine and 7.25 wt.-% of a polyvinylacetal binder comprising 39.9 mole-% vinyl alcohol, 1.2 mole-% vinyl acetate, 15.4 mole-% acetal groups derived from acetaldehyde, 36.1 mole-% acetal groups derived from butyric aldehyde and 7.4 mole-% acetal groups derived from 4-formylbenzoic acid |
| 0.08 g | Kayamer PM-2 (ester of 1 mole phosphonic acid and 1.5 moles hydroxyethyl methacrylate) |
| 10.98 g | monomer (see Table 1) |
| 0.6 g | ethoxylated bisphenol-A-dimethacrylate |
| 1.12 g | 2-phenyl-4-(2-chlorophenyl)-5-(4-diethylaminophenyl)-oxazole |
| 0.273 g | 2,2-bis(2-chlorophenyl)-4,5,4',5'-tetraphenyl-2'H-[1,2']biimidazolyl |
| 0.497 g | mercapto-3-triazole |

TABLE 3

(composition sensitive to 810 to 830 nm)

| | |
|---|---|
| X g | binder 1: terpolymer prepared by polymerizatiooon of 470 parts by weight styrene, 336 parts by weight methyl methacrylate and 193 parts by weight methacrylic acid, as 30% solution in propylene glycol monomethylether |
| Y g | binder 2: Ioncryl (acrylic resin from SC Johnson & Son Inc., USA) |
| Z g | monomer (see Table 1) |
| 0.10 g | N-phenyliminodiacetic acid |
| 0.30 g | 2-(4-methoxyphenyl)-4,6-trichloromethyl-1,3,5-triazine |
| 0.075 g | Basonyl Violet 610 from BASF |
| 0.021 g | phosphoric acid (85%) |
| 0.09 g | IR dye from FEW Chemicals GmbH (Wolfen)[3)] |
| 0.33 g | 5-(4-vinylbenzyl)thio-1,3,4-thiadiazole-2-thiol |
| 30 ml | propylene glycol monomethylether |
| 3 ml | acetone |

3)

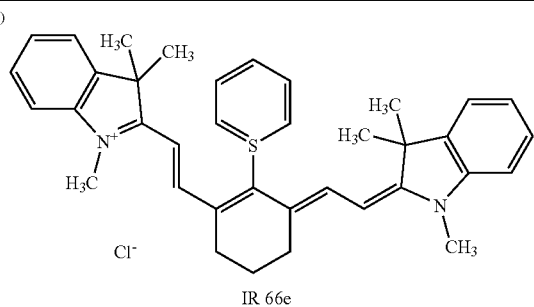

IR 66e

The obtained samples were coated with an overcoat layer by applying an aqueous solution of poly(vinylalcohol) (Celvol 203 available from Airproducts; degree of hydrolysis: 88%). After drying for 4 minutes at 90° C., a printing plate precursor with a dry layer weight of the overcoat layer of about 2.5 g/m² was obtained.

The plates prepared with a composition according to Table 2, sensitive to 405 nm, were image-wise exposed with the image-setter Andromeda from Lithotech (30 mW, 405 nm UV laser diode) (a UGRA/FOGRA Postscript strip, version 2.0 ERS, was used for this purpose) and then immediately heated in an oven for 2 minutes at 90° C. The plates were then developed with developer D1 of Table 4.

The plates prepared with a composition according to Table 3 were image-wise exposed with the image-setter Trendsetter 3244 from Creo (40-90 mJ/cm², 830 nm laser diode) and a UGRA/FOGRA Postscript test strip, version 2.0 EPS, which contains different elements for evaluating the quality of copies, was used. Immediately after exposure, the plates were heated in an oven for 2 minutes at 90° C. Developer D2 of Table 4 was subsequently used for developing.

In all exposed and then heated plates, the overcoat layer was first removed with water and then the respective developer was distributed on the plates. After a dwell time of 30 s, the plate was further rubbed with a tampon for another 30 s and then the entire plate was rinsed with water. After this treatment, the exposed portions remained on the plate. For the assessment of their photosensitivity, the plates were blackened in a wet state with printing ink.

TABLE 4

| Developer D1 | Water | 94.84 wt.-% |
|---|---|---|
| | KOH | 0.169 wt.-% |
| | PC1199[1)] | 4.992 wt.-% |
| Developer D2 | Water | 91.9 wt.-% |
| | REWOPOL ® NLS 28[2)] | 3.4 wt.-% |
| | 2-phenoxyethanol | 1.8 wt.-% |
| | diethanolamine | 1.1 wt.-% |
| | TEXAPON ® 842[3)] | 1.0 wt.-% |
| | NEKAL ® Paste[4)] | 0.6 wt.-% |
| | 4-toluene sulfonic acid | 0.2 wt.-% |

[1)]ethoxylated/propoxylated $C_{10}$-$C_{12}$ alcohol from Polygon
[2)]available from REWO
[3)]available from Henkel
[4)]available from BASF For the preparation of a lithographic printing plate, a printing layer was applied to the aluminum foil, as explained above, exposed, heated, developed, and after rinsing with water, the developed plate was rubbed with an aqueous solution of 0.5% phosphoric acid and 6% gum arabic. The thus prepared plate was loaded in a sheet-fed offset printing machine and used for printing with an abrasive printing ink (Offset S 7184 available from Sun Chemical, containing 10% potassium carbonate). The background areas were examined for possible ink acceptance.

The following tests were carried out to determine how the monomers (I) influence the properties of lithographic printing plates.

Developability

Unexposed 5 cm×30 cm plate strips were heated in an oven for 2 minutes at 90° C., the overcoat layer was washed off and the strip was dried. The strips were then immersed gradually in the respective developer such that every 5 seconds 4 cm more were immersed in the developer bath. After a total dwell time of 50 seconds the strips were removed from the developer bath and the developing time was determined as the time necessary to completely remove the coating. The results can be inferred from Tables 5 and 6.

Photosensitivity (1) plates sensitive to 830 nm:

Sensitivity was determined using different energy values. The sensitivity of a certain plate was defined as the energy necessary to obtain a clean image of all microelements of the UGRA/FOGRA Postscript strip version 2.0 ERS. Both fresh and aged plates (thermal ageing: 16 hours at 60° C.) were examined. The results can be inferred from Table 5.

(2) plates sensitive to 405 nm:

Sensitivity was determined by means of overall exposure with the exposure unit mentioned above for this type of plate. The sensitivity was defined as the energy necessary to obtain two steps of the UGRA gray scale. Both fresh and aged plates (thermal ageing: 1 hour at 90° C.) were examined. The results can be inferred from Table 6.

Formation of Sludge in the Developer Bath

For the evaluation of the formation of sludge, the following method was used.

A Raptor Polymer HW type processor from Glunz & Jensen, which can be used to preheat the plates (110° C. measured at the back side of the plate), wash off the overcoat layer with tap water, develop the plate with the help of two brushes at 23° C. for 20 seconds, rinse the plate with tap water and gum the plates with the gumming solution 850 S from Kodak Polychrome Graphics, was filled with the respective developer (see Table 4). Each plate was exposed with a 5% screen, preheated, and the overcoat layer was washed off before the plate was immersed in the developer. After 15 m² of a certain plate per liter of developer have been developed, the developer bath was emptied. The developer bath of the processor was then examined for residual sludge; if applicable, the removability of the sludge was evaluated subsequently. The following evaluation scale was used:

(A) no or very little formation of sludge,
(B) formation of sludge; could easily be removed by rinsing with tap water,
(C) formation of sludge; could only be removed after prolonged rising with tap water,
(D) formation of sludge: could not be removed by rinsing with tap water but required the use of the cleanser dipropylene glycol monomethylether.

The results can be inferred from Tables 5 and 6.

Dot Loss

The term "dot loss" describes the change in the tonal values (TV) of a linearized plate during printing. Linearization means that deviations from a predetermined set tonal value (STV) are compensated for by means of RIP software (RIP=raster image processor). The accessible measured values are the tonal values before printing (TVB) and the tonal values after printing (TVA) on the printing form. For determining the dot loss, the linearized tonal values before printing (TVB) are measured. The linearized and developed printing plate described in the present invention is used in a printing machine for 10,000 prints, cleaned and then again subjected to a tonal value examination, which shows the tonal values after printing (TVA).

Then the dot loss is calculated using equation 1 integrating all predetermined set tonal values (STV).

$$\text{Dot loss} = \int_0^{100} [TVB - STV] \, dSTV - \int_0^{100} [TVA - STV] \, dSTV \quad (1)$$

Ideally, the dot loss should converge toward zero. In other words: The lower the dot loss, the better the plate.

The plates of Comparative Examples 1 and 11, i.e. plates with a considerable dot loss during printing at different tonal values, are used as a reference. The relative dot loss is calculated using equation (2) below:

$$\text{relative dot loss} = \frac{\text{dot loss (sample)}}{\text{dot loss (reference)}} \cdot 100\% \quad (2)$$

The results can be inferred from Tables 5 and 6.

Layer Loss Due to Developer

This test is used to examine whether the developer causes an undesired loss of coating material in the image areas. For this purpose, an exposed plate (for exposure energy applied confer Tables 5 and 6) with a size of 1 dm² was placed coating side up in a bowl with a diameter of 130 mm and covered with 50 ml developer at 25° C.

After 5 minutes, the sample was removed from the developer and dried for 5 minutes at 90° C. The layer loss due to the developer was determined as follows:

$$\text{layer loss} = \frac{(\text{weight of the untreated sample}) - (\text{weight of the treated sample})}{(\text{weight of the untreated sample})} \cdot 100\%$$

The lower the layer loss, the better the plate. The results are shown in Table 5.

Adhesion Test

This test was carried out to simulate abrasion on the printing machine. The plates were exposed and preheated as described above for both plate types. Then 10 cm×20 cm plate strips were placed in a water bath for 15 minutes at 60° C. and then quickly air-dried. The samples were then dried in an oven for 4 minutes at 60° C. After cooling to room temperature, a Tesa® adhesive tape strip was applied to one part of the coating and a 5 kg cylinder was rolled over the plate to guarantee optimal adhesion of the adhesive tape.

Then the adhesive tape was pulled off evenly and the optical density of those portions that did not have an adhesive tape on them was compared with the optical density of the portions that had the adhesive tape on them. The smaller the difference between those two optical density values, the better the plate.

The following evaluation scale was used:

+++ no difference in optical density, no visible pinholes even under the microscope; excellent
++ no difference in optical density, small number of pinholes visible under the microscope; good
+ no difference in optical density, larger number of pinholes visible to the naked eye; acceptable
− total loss of optical density, loss of optical density can be measured with the densitometer, but is difficult to discern with the naked eye; not acceptable
−− total loss of optical density, loss is visible to the naked eye; not acceptable The results can be inferred from Tables 5 and 6.

Tackiness

Tackiness is another problem that can arise in photopolymer plates. It is difficult to produce such plates on a large scale since during production rollers come into contact with the photopolymer surface. It is therefore advisable to keep tackiness as low as possible. Tackiness was examined by first pressing on the plate with a previously degreased thumb and then again with a thumb covered with a laboratory latex glove.

The following evaluation scale was used:

(1) excellent; no tackiness was observed either with or without the glove;
(2) good; slight tackiness was found with the glove, no tackiness with the naked thumb;
(3) acceptable; slight tackiness both with and without the glove;
(4) not acceptable; considerable tackiness with the glove, no or only slight tackiness without glove;
(5) not acceptable; considerable tackiness both with and without the glove.

The results can be inferred from Tables 5 and 6.

A comparison of the results shows that a use of the monomers m1 to m4 according to the present invention only leads to a negligible formation of sludge even at high loads; furthermore, improved developability, improved thermal stability and a higher degree of sensitivity were found compared to the use of the comparative monomers cm1 to cm10. The number of copies obtained during printing was not affected by monomers m1 to m4.

TABLE 5

(plates sensitive to 810 to 830 nm)

| Example | Monomer | X g binder 1 | Y g binder 2 | Z g monomer | Developability (s) | Sensitivity of a fresh plate (mJ/cm$^2$) | Sensitivity of a plate subjected to a heat treatment (mJ/cm$^2$) | Formation of sludge | Tackiness | Layer loss due to developer (%) | Wet adhesion | Dot loss after 10,000 copies | Number of copies |
|---|---|---|---|---|---|---|---|---|---|---|---|---|---|
| 1 | m1 | 4.2 | 1.26 | 9 | 8 | 45 | 50 | A | 2 | 5 | +++ | 30 | >100,000 |
| 2 | m1 | 4.7 | 1.4 | 7.9 | 8 | 55 | 55 | A | 2 | 5 | ++ | 40 | >100,000 |
| 3 | m1 | 5.3 | 1.6 | 6.7 | 4 | 65 | 70 | A | 1 | 10 | ++ | 50 | >100,000 |
| 4 | m1 | 5.9 | 1.8 | 5.5 | 4 | 85 | 80 | A | 1 | 15 | ++ | 50 | >100,000 |
| 5 | m2 | 4.2 | 1.26 | 9 | 8 | 45 | 50 | A | 2 | 5 | +++ | 35 | >100,000 |
| 6 | m2 | 4.7 | 1.4 | 7.9 | 8 | 60 | 65 | A | 2 | 5 | +++ | 45 | >100,000 |
| 7 | m3 | 5.3 | 1.6 | 6.7 | 4 | 65 | 75 | A | 1 | 5 | ++ | 40 | >100,000 |
| 8 | m4 | 5.9 | 1.8 | 5.5 | 4 | 85 | 80 | A | 1 | 15 | ++ | 55 | >100,000 |
| 9 | m3 | 4.2 | 1.26 | 9 | 8 | 50 | 60 | A | 2 | 5 | +++ | 40 | >100,000 |
| 10 | m3 | 4.7 | 1.4 | 7.9 | 8 | 60 | 65 | A | 2 | 5 | ++ | 45 | >100,000 |
| 11 | m3 | 5.3 | 1.6 | 6.7 | 4 | 70 | 70 | A | 1 | 15 | +++ | 50 | >100,000 |
| 12 | m3 | 5.9 | 1.8 | 5.5 | 4 | 75 | 70 | A | 1 | 15 | ++ | 60 | >100,000 |
| 13 | m4 | 4.2 | 1.26 | 9 | 8 | 55 | 65 | A | 2 | 5 | +++ | 45 | >100,000 |
| 14 | m4 | 4.7 | 1.4 | 7.9 | 8 | 65 | 70 | A | 2 | 15 | ++ | 50 | >100,000 |
| 15 | m4 | 5.3 | 1.6 | 6.7 | 4 | 70 | 75 | A | 1 | 15 | +++ | 60 | >100,000 |
| 16 | m4 | 5.9 | 1.8 | 5.5 | 4 | 80 | 70 | A | 1 | 15 | ++ | 65 | >100,000 |
| Comp. 1 | cm1 | 4.2 | 1.26 | 9 | 16 | 75 | 95 | D | 2 | 25 | + | 100 | >100,000 |
| Comp. 2 | cm2 | 4.2 | 1.26 | 9 | 16 | 45 | 80 | B | 2 | 15 | − | 110 | >100,000 |
| Comp. 3 | cm3 | 4.2 | 1.26 | 9 | 20 | 40 | 85 | B | 3 | 10 | −− | 120 | >100,000 |
| Comp. 4 | cm4 | 4.2 | 1.26 | 9 | 20 | 55 | 75 | B | 3 | 15 | − | 120 | >100,000 |
| Comp. 5 | cm5 | 4.2 | 1.26 | 9 | 16 | 60 | 90 | B | 3 | 20 | −− | 110 | >100,000 |
| Comp. 6 | cm6 | 4.2 | 1.26 | 9 | 16 | 65 | 95 | B | 3 | 20 | − | 130 | >100,000 |
| Comp. 7 | cm7 | 4.2 | 1.26 | 9 | 20 | 40 | 90 | C | 4 | 15 | −−− | 70 | >100,000 |
| Comp. 8 | cm8 | 4.2 | 1.26 | 9 | 20 | 65 | 95 | C | 3 | 25 | −−− | 120 | >100,000 |
| Comp. 9 | cm9 | 4.2 | 1.26 | 9 | 20 | 180 | 190 | A | 2 | 45 | −−− | 170 | abrasion at >40,000 |
| Comp. 10 | cm10 | 4.2 | 1.26 | 9 | 20 | 190 | 190 | A | 2 | 50 | −−− | 190 | abrasion at >50,000 |
| Comp. 11 | cm11 | 4.2 | 1.26 | 9 | 12 | 55 | 75 | B | 3 | 20 | −− | 90 | >100,000 |

TABLE 6

(plates sensitive to 405 nm)

| Example | Monomer | Developability (s) | Sensitivity of a fresh plate (µJ/cm$^2$) | Sensitivity of a plate subjected to a heat treatment (µJ/cm$^2$) | Formation of sludge | Tackiness | Dot loss after 10,000 copies | Number of copies |
|---|---|---|---|---|---|---|---|---|
| 17 | m1 | 8 | 35 | 40 | A | 2 | 65 | >100,000 |
| 18 | m2 | 8 | 40 | 35 | A | 1 | 55 | >100,000 |
| 19 | m3 | 8 | 45 | 50 | A | 2 | 60 | >100,000 |
| 20 | m4 | 12 | 40 | 45 | A | 1 | 55 | >100,000 |
| Comp. 12 | cm1 | 20 | 65 | 95 | D | 2 | 100 | >100,000 |
| Comp. 13 | cm2 | 16 | 60 | 95 | B | 2 | 90 | >100,000 |
| Comp. 14 | cm3 | 16 | 75 | 105 | C | 3 | 95 | >100,000 |
| Comp. 15 | cm7 | 24 | 65 | 105 | C | 4 | 120 | abrasion at 80,000 |
| Comp. 16 | cm8 | 24 | 110 | 120 | B | 2 | 115 | abrasion at 70,000 |
| Comp. 17 | cm9 | 4 | no image obtained | no image obtained | A | 2 | 150 | |
| Comp. 18 | cm10 | 4 | no image obtained | no image obtained | A | 2 | 180 | |
| Comp. 19 | cm11 | 15 | 60 | 85 | C | 3 | 110 | >100,000 |

The invention claimed is:

1. A radiation-sensitive element comprising
   (a) a substrate and
   (b) a radiation-sensitive coating comprising
      (i) at least one component selected from photoinitiators and sensitizer/coinitiator systems which absorbs radiation of a wavelength in the range of 250 to 1,200 nm; and
      (ii) at least one oligomer A of formula (I)

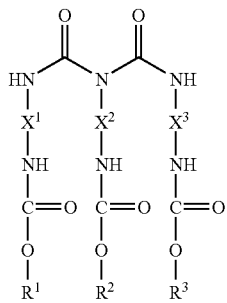

(I)

wherein $X^1$, $X^2$ and $X^3$ are independently selected from the group consisting of straight-chain or cyclic $C_4$-$C_{12}$ alkylene and $C_6$-$C_{10}$ arylene, a heterocyclic group, a heteroaromatic group, and combinations of two or more of the above, $R^1$, $R^2$ and $R^3$ are independently selected from the group consisting of

        (II)

and

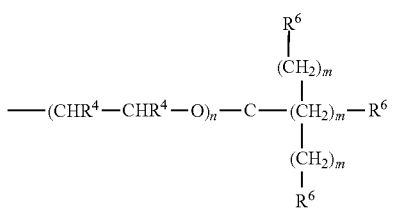        (III)

wherein
   each $R^4$ is independently selected from the group consisting of a hydrogen atom and $CH_3$, each n is independently 0 or an integer from 1 to 20, each m is independently 0 or 1;
   if n in formula (II) is 0, $R^5$ is independently selected from the group consisting of

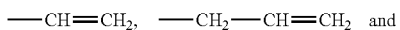

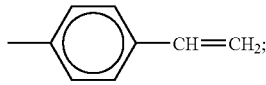

if n in formula (II) is an integer from 1 to 20, $R^5$ is independently selected from the group consisting of

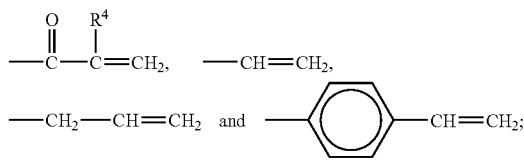

and each $R^6$ is independently selected from the group consisting of a hydrogen atom,

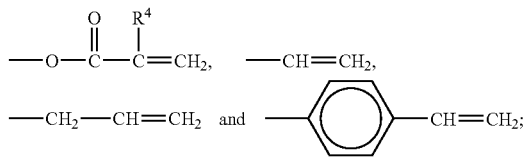

with the proviso that (1) n=0 in at least two of the groups $R^1$, $R^2$ and $R^3$, and (2) n>2 in the third one of the groups $R^1$, $R^2$ and $R^3$, and (3) at least one group $R^6$ is different from H in formula (III).

2. The radiation-sensitive element of to claim 1, wherein the radiation-sensitive coating furthermore comprises at least one additional component selected from the group consisting of binders, thermopolymerization inhibitors, colorants, plasticizers, chain transfer agents, leuco dyes, inorganic fillers and surfactants.

3. The radiation-sensitive element of claim 1, wherein $X^1$=$X^2$=$X^3$.

4. The radiation-sensitive element of claim 3, wherein $X^1$=$X^2$=$X^3$=hexamethylene.

5. The radiation-sensitive element of claim 1, wherein in the third $n \geq 6$.

6. The radiation-sensitive element of claim 1, wherein the third one group of $R^1$, $R^2$ and $R^3$ in which n>2 has the formula (II).

7. The radiation-sensitive element of claim 1, wherein oligomer A is the reaction product of hexamethylene diisocyanate biuret, glycerin-1,3-di(meth)acrylate and polypropylene glycol(meth)acrylate or polyethylene glycol(meth)acrylate.

8. The radiation-sensitive element of claim 1, wherein the coating is sensitive to a wavelength in the range of 300 to 410 nm, or sensitive to a wavelength in the range of 750 to 1,100 nm.

9. The radiation-sensitive element of claim 1, wherein an oxygen-impermeable overcoat layer is provided on top of theradiation-sensitive coating.

10. The radiation-sensitive element of claim 1, wherein the substrate is an aluminum foil or plate.

11. A process for producing an imaged element comprising
   (a) image-wise exposure of the element of claim 1 to radiation of a wavelength adjusted to the photoinitiator or sensitizer present in theradiation-sensitive layer of the element; and
   (b) removing the non-exposed areas by means of an aqueous alkaline developer.

12. The process of claim 11, wherein the image-wise exposed element obtained in step (a) is heated prior to step (b).

13. The process of claim 11, wherein the imaged element obtained in step (b) is heated and/or subjected to overall exposure.

14. A radiation-sensitive composition comprising
(i) at least one component selected from photoinitiators and sensitizer/coinitiator systems which absorbs radiation of a wavelength in the range of 250 to 1,200 nm;
(ii) at least one oligomer A of formula (I)

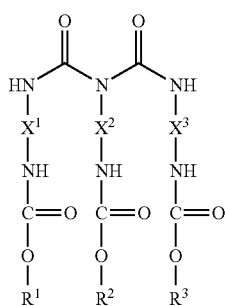

(I)

wherein $X^1$, $X^2$ and $X^3$ are independently selected from the group consisting of straight-chain or cyclic $C_4$-$C_{12}$ alkylene and $C_6$-$C_{10}$ arylene, a heterocyclic group, a heteroaromatic group, and combinations of two or more of the above,
$R^1$, $R^2$ and $R^3$ are independently selected from the group consisting of

 (II)

and

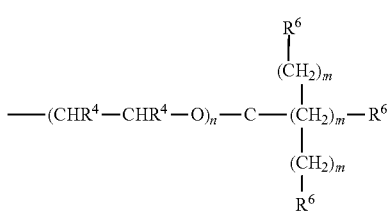 (III)

wherein
each $R^4$ is independently selected from the group consisting of a hydrogen atom and $CH_3$, each n is independently 0 or an integer from 1 to 20, each m is independently 0 or 1;
if n in formula (II) is 0, $R^5$ is independently selected from the group consisting of

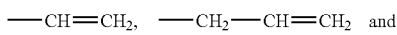

if n in formula (II) is an integer from 1 to 20, $R^5$ is independently selected from the group consisting of

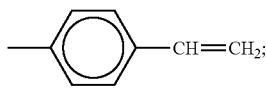

-continued

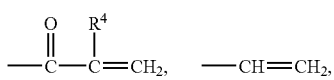

and each $R^6$ is independently selected from the group consisting of a hydrogen atom,

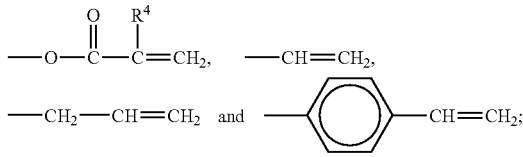

with the proviso that (1) n=0 in at least two of the groups $R^1$, $R^2$ and $R^3$, and (2) n>2 in the third one of the groups $R^1$, $R^2$ and $R^3$, and (3) at least one group $R^6$ is different from H in formula (III); and
(iii) a solvent or solvent mixture.

15. The radiation-sensitive composition of claim 14, additionally comprising at least one additional component selected from the group consisting of binders, thermopolymerization inhibitors, colorants, plasticizers, chain transfer agents, leuco dyes, inorganic fillers and surfactants.

16. A process for the production of the radiation-sensitive element of claim 1 comprising:
(a) providing the pre-treated or untreated substrate;
(b) applying a radiation-sensitive coating; and
(c) drying.

17. The process of claim 16, wherein after step (c) an oxygen-impermeable overcoat layer is applied.

18. A radiation-sensitive element comprising
(a) a substrate and
(b) a radiation-sensitive coating comprising
(i) at least one component selected from photoinitiators and sensitizer/coinitiator systems which absorbs radiation of a wavelength in the range of 250 to 1,200 nm; and
(ii) at least one oligomer A of formula (I)

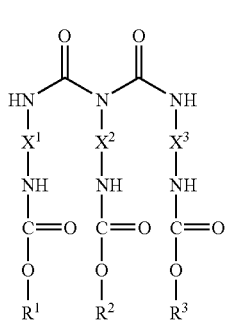

(I)

wherein $X^1$, $X^2$ and $X^3$ are independently selected from the group consisting of straight-chain or cyclic $C_4$ -$C_{12}$ alkylene and $C_6$ -$C_{10}$ arylene, a heterocyclic group, a heteroaromatic group and combinations of two or more of the above,
$R^1$, $R^2$ and $R^3$ are independently selected from the group consisting of

 (II)

and

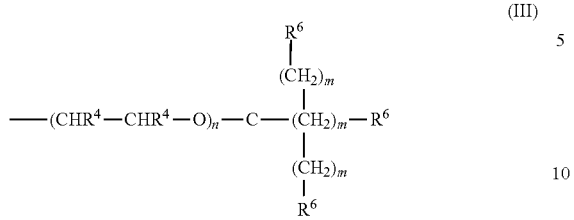 (III)

wherein
each $R^4$ is independently selected from the group consisting of a hydrogen atom and $CH_3$, each n is independently 0 or an integer from 1 to 20, each m is independently 0 or 1;
if n in formula (II) is 0, $R^5$ is independently selected from the group consisting of

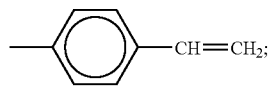 and

—⟨⟩—CH=CH₂;

if n in formula (II) is an integer from 1 to 20, $R^5$ is independently selected from the group consisting of

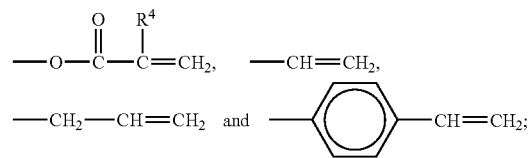

and each $R^6$ is independently selected from the group consisting of a hydrogen atom and

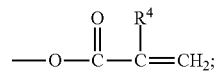

with the proviso that (1) n=0 in at least one of the groups R', $R^2$ and $R^3$, and (2) n>2 in at least one of the groups R', $R^2$ and $R^3$, and (3) at least one group $R^6$ is different from H in formula (III).

* * * * *

UNITED STATES PATENT AND TRADEMARK OFFICE
CERTIFICATE OF CORRECTION

| | | |
|---|---|---|
| PATENT NO. | : 7,955,776 B2 | Page 1 of 1 |
| APPLICATION NO. | : 11/995213 | |
| DATED | : June 7, 2011 | |
| INVENTOR(S) | : Harald Baumann et al. | |

It is certified that error appears in the above-identified patent and that said Letters Patent is hereby corrected as shown below:

| Issued Patent | | Description of Error |
|---|---|---|
| Column | Line | |
| Title Page (Attorney) | Item (74) | Delete "J. Lanny Tucke" and insert -- J. Lanny Tucker --, therefor. |
| 30 | 36 (Approx.) | In Claim 5, after "third" insert -- group --. |
| 30 | 52 | In Claim 9, delete "theradiation-" and insert -- the radiation- --, therefor. |
| 30 | 58 | In Claim 11, delete "theradiation-" and insert --the radiation- --, therefor. |
| 30 | 66 | In Claim 13, delete "and/or" and insert -- or --, therefor. |
| 34 | 6-8 | In Claim 18, delete " 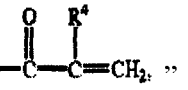 " and insert --  --, therefor. |
| 34 | 23 | In Claim 18, delete "R'," and insert -- $R^1$, --, therefor. |
| 34 | 24 | In Claim 18, delete "R'," and insert -- $R^1$, --, therefor. |

Signed and Sealed this
Sixteenth Day of August, 2011

David J. Kappos
*Director of the United States Patent and Trademark Office*